United States Patent
Lai

(10) Patent No.: US 7,427,781 B2
(45) Date of Patent: Sep. 23, 2008

(54) THIN FILM TRANSISTOR ARRAY SUBSTRATE

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 126 days.

(21) Appl. No.: 10/908,638

(22) Filed: May 20, 2005

(65) Prior Publication Data

US 2006/0097255 A1    May 11, 2006

(30) Foreign Application Priority Data

Oct. 28, 2004    (TW) .............................. 93132700 A

(51) Int. Cl.
*G02F 1/1343* (2006.01)

(52) U.S. Cl. .............................. 257/72; 257/59; 349/54; 349/55; 349/192

(58) Field of Classification Search ................... 349/54, 349/55, 192, 139–141; 257/72, 59
See application file for complete search history.

(56) References Cited

U.S. PATENT DOCUMENTS

| 7,230,658 B2 * | 6/2007 | Chae ............................ 349/48 |
| 2004/0119898 A1 | 6/2004 | Song |
| 2006/0077313 A1 * | 4/2006 | Liu et al. ...................... 349/55 |
| 2006/0092341 A1 * | 5/2006 | Huang et al. .................. 349/38 |
| 2006/0146215 A1 * | 7/2006 | Huang et al. .................. 349/43 |

FOREIGN PATENT DOCUMENTS

| JP | 2001-125139 | 5/2001 |
| TW | 516238 | 1/2003 |

* cited by examiner

*Primary Examiner*—Phat X. Cao
*Assistant Examiner*—Abul Kalam
(74) *Attorney, Agent, or Firm*—Jianq Chyun IP Office

(57) ABSTRACT

A thin film transistor array including a plurality of lower electrodes and a plurality of common lines for the storage capacitor of pixels is provided. The plurality of lower electrodes is electrically connected to the plurality of common lines by a connecting conductive layer, and the lower electrodes and the pixel electrodes serve as the conductive layers of the capacitor. The electrode branches are formed on the pixel area where the emitting efficiency is poor, the storage capacitance can be improved without decreasing the aperture ratio of the pixels, so as to improve the performance of the liquid crystal display apparatus.

14 Claims, 16 Drawing Sheets

THIN FILM TRANSISTOR ARRAY SUBSTRATE

CROSS-REFERENCE TO RELATED APPLICATION

This application claims the priority benefit of Taiwan application serial no. 93132700, filed on Oct. 28, 2004. All disclosure of the Taiwan application is incorporated herein by reference.

BACKGROUND OF THE INVENTION

1. Field of the Invention

This invention generally relates to a display device and a repairing method and especially to a thin film transistor array and a repairing method thereof.

2. Description of Related Art

The rapid progress of the multi-media society is most likely benefited from the accelerated advancement of semiconductor devices or display devices. As for a display, the Thin Transistor Liquid Crystal Display (i.e. TFT-LCD) has become the trend in the market, owing to its superiorities in picture quality, space efficiency and low power consumption rate, and radiation-free, etc.

The Thin Transistor Liquid Crystal Display (i.e. TFT-LCD) is mainly consisted of a thin film transistor array, color filter substrate and liquid crystal layer. The thin film transistor array is consisted of thin film transistors arranged in multiple arrays and pixel electrodes corresponding with each thin film transistor. The thin film transistor is used as a switch element of the liquid crystal display unit. Moreover, in order to control the individual pixel unit, the particular pixel is selected through scan line and data line, and the corresponding display information of the pixel is displayed by providing a suitable operating voltage. Moreover, a portion of the area of the above mentioned pixel electrode normally covers the scan line or the common line to form a storage capacitor. In the conventional technology, the popular storage capacitors can be assorted into the Metal-Insulator-Metal (i.e. MIM) capacitor and the Metal-Insulator-ITO (i.e. MII) capacitor. The above two structures of storage capacitor will be described as follows.

FIG. 1 shows a cross-sectional view of a conventional storage capacitor with the MIM structure. In the conventional pixel structure as shown in FIG. 1, the storage capacitor Cst with the MIM structure is created with the scan line or the common line 100 and an upper electrode 120, disposed above the scan line or the common line 100. And in the MIM storage capacitor, the scan line or the common line 100 is electrically insulated from the upper electrode with a gate insulating layer 110. Moreover, through the contact window 132 of a protective layer 130, the pixel electrode 140 is electrically connected with the upper electrode 120.

FIG. 2 shows a cross-sectional view of a conventional storage capacitor with the MII structure. In the conventional pixel structure of FIG. 2, the storage capacitor of MII structure is created with the scan line or the common line 200 and a pixel electrode 230, disposed above the common line or the scan line 200. The difference between the storage capacitor with the MII structure and that with the MIM structure is that the scan line or the common line 200 in the MII structure is electrically insulated from the pixel electrode 230 through a gate insulating layer 210 and a protective layer 220.

In general, the emitting efficiency is better if that the aperture ratio of the pixel structure is larger. On the other hand, the photoelectric function of a liquid crystal display is better if the storage capacitance Cst is larger. However, with the conventional pixel structure of a liquid crystal display, the aperture ratio of the pixel structure can be decreased, if the storage capacitance Cst is increased by increasing the common line area. In order to increase the storage capacitance Cst without influencing the aperture ratio, the thickness of the gate insulating layer 210 and/or the protective layer 220 must decrease. However, the reliability of the thin film transistor element can be decreased, if the thickness of the gate insulating layer 210 and/or the protective layer 220 is decreased.

Furthermore, defects in the manufacturing process and other factors that causes particles falling into the gate insulating layer and/or the protective layer or cavities forming in the gate insulating layer and/or a protective layer can cause the capacitor leakage phenomenon. Therefore, the pixel display is abnormal and the display quality is poor.

SUMMARY OF THE INVENTION

An object of the present invention is to provide a thin film transistor array, wherein the storage capacitance is increased and the performance of the liquid crystal display apparatus is improved without affecting the aperture ratio and the reliability of the transistor element.

Another object of the present invention is to provide a thin film transistor repairing method, for avoiding a leakage generated in the upper/lower electrodes of the storage capacitor, which is induced by particles.

Another object of the present invention is to provide a storage capacitor, which is suitable to be integrated in a pixel unit, for improving the performance of liquid crystal display apparatus.

The present invention provides a thin film transistor array, which includes a color filter substrate and a liquid crystal layer. Several protrusions and several first slits are positioned on the color filter substrate. The thin film transistor array includes: a substrate, several scan lines, several data lines, several thin film transistors, several pixel electrodes, several common lines, several lower electrodes, and several connecting conductive layers. The data lines and the scan lines define a plurality of pixel areas on the substrate, and the protrusions and the first slits are accordingly positioned in these pixel areas.

In accordance to the above mentioned thin film transistor array, each thin film transistor and each pixel electrode are positioned in the one of these pixel areas. Further, the thin film transistor is driven by the scan line and the data line, and the pixel electrode is electrically connected with a corresponding thin film transistor. Each common line is positioned between the two neighboring scan lines, and a part of each pixel electrode is positioned over a corresponding common line. More particularly, each electrode includes an electrode main body and several electrode branches corresponding with one of the protrusions or the first slits. The electrode main body of each lower electrode is positioned between each pixel electrode and the corresponding common line, and each pixel electrode covers a part of the corresponding electrode branch.

Furthermore, each connecting conductive layer is positioned over parts of the lower electrode and the common line, and each connecting conductive layer is electrically connected with the lower electrode and the common line. In an embodiment of the present invention, the connecting conductive layer is comprised of a first contact, a second contact and a neck portion, for example. The first contact of each connecting conductive layer is positioned over the corresponding lower electrode, the second contact of each connecting conductive layer is positioned over the corresponding common line, and the neck portion connects the first contact and the second contact.

The present invention provides a storage capacitor, which is suitable to be integrated in a pixel unit. The storage capacitor mainly includes an alternate capacitor conductive layer, a lower electrode, a connecting conductive layer and a pixel electrode. The lower electrode is positioned above the alternate capacitor conductive layer. The lower electrode includes an electrode main body and several electrode branches which are extended from the electrode main body. The connecting conductive layer is positioned over parts of the capacitance conductive layer and the electrode main body of the lower electrode, and the connecting conductive layer is electrically connected with the lower electrode and the alternate capacitor conductive layer. The pixel electrode is positioned at least over the lower electrode and the alternate capacitor conductive layer, and the pixel electrode and the lower electrode serve as the conductive layers of the storage capacitor.

In accordance with the description of the embodiments of the present invention, the over mentioned thin film transistor array also includes a protective layer, which is positioned between the pixel electrode and the lower electrode, and between a part of the connecting conductive layer and the lower electrode. Furthermore, the thin film transistor array also includes a gate insulating layer which is positioned between the lower electrode and the common line. In an embodiment of the present invention, there are several first contact windows and several second contact windows in the protective layer and the gate insulating layer, the first contact window exposes the lower electrode, and the second contacting window exposes the common line. And the first contact of the connecting conductive layer is electrically connected with the lower electrode through the first contact window, while the second contact of the connecting conductive layer is electrically connected with the common line through the second contact window.

According to the embodiments of the present invention, the material of the connection conductive layer is, for example, the same as the material of the pixel electrode, such as indium tin oxide (ITO) or indium zinc oxide (IZO).

According to the embodiments of the present invention, the electrode branch of the lower electrode also includes a black matrix corresponding with the color filter substrate. In an embodiment of the present invention, each pixel electrode includes, for example, several second slits, and the electrode branch of the lower electrode is disposed, for example, offside from these second slits.

The present invention provides a thin film transistor repairing method, for repairing the over mentioned thin film transistor array. When a first particle and/or a first cavity is present between an electrode branch of the lower electrode and a corresponding pixel electrode, a defective capacitor is created. The thin film transistor repairing method includes cutting the electrode branch of the lower electrode of the defective capacitor, to electrically insulate the electrode branch from the lower electrode.

According to the embodiments of the present invention, laser cutting is used for cutting the electrode branch of the lower electrode of the defective capacitor.

According to the embodiments of the present invention, when a second particle and/or a second cavity is present between a pixel electrode and a corresponding lower electrode, the repairing method also includes deleting a part of the pixel electrode to electrically insulate the second particle and/or the cavity from the pixel electrode. In an embodiment of the present invention, the method of deleting the part of the pixel electrode includes performing laser deleting.

The present invention provides another thin film transistor repairing method, for repairing the over mentioned thin film transistor array which includes a connecting conductive layer. When a particle and/or a cavity is present between the lower electrode and a corresponding pixel electrode, a defective capacitor is created. The repairing method is, for example, to cut off the neck portion of connecting conductive layer of the defective capacitor to electrically insulate the common line from the lower electrode. Then, the pixel electrode of the defective capacitor and the lower electrode are welded together to electrically connect the two components. The method of cutting off the neck portion of the connecting conductive layer includes performing laser cutting, while the method of welding the pixel electrode and the lower electrode together includes performing laser welding.

According to the present invention, the storage capacitance is increased through the electrode branches of the lower electrode and the display quality of the panel is improved. When a capacitor leakage occurs in the electrode branch of the lower electrode, the repairing process will cut off the electrode branch where the capacitor leakage is generated to electrically insulate that electrode branch from the lower electrode. A normal function of other storage capacitors is thus maintained.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

In accordance to the present invention, the storage capacitance is increased by using a lower electrode with electrode branches. These electrode branches of the lower electrode are positioned in the pixel area where emitting efficiency is poor, so that the effect on the aperture ratio of the pixel structure can be decreased. Furthermore, when particles and/or cavities are present between the pixel electrode and the lower electrode of the storage capacitor, the storage capacitor of the present invention is transformed from a MII structure capacitor to a MIM structure capacitor, to avoid a storage capacitor leakage induced by the particles and/or the cavities. The following description provides a full and complete description of certain embodiments of the present invention. Various modifications, alternate construction, and equivalent may be made by those skilled in the art without changing the scope of spirit of the invention. According the following description and illustrations should not be construed as limiting the scope of the invention which is defined by the following claims.

Figure 1:
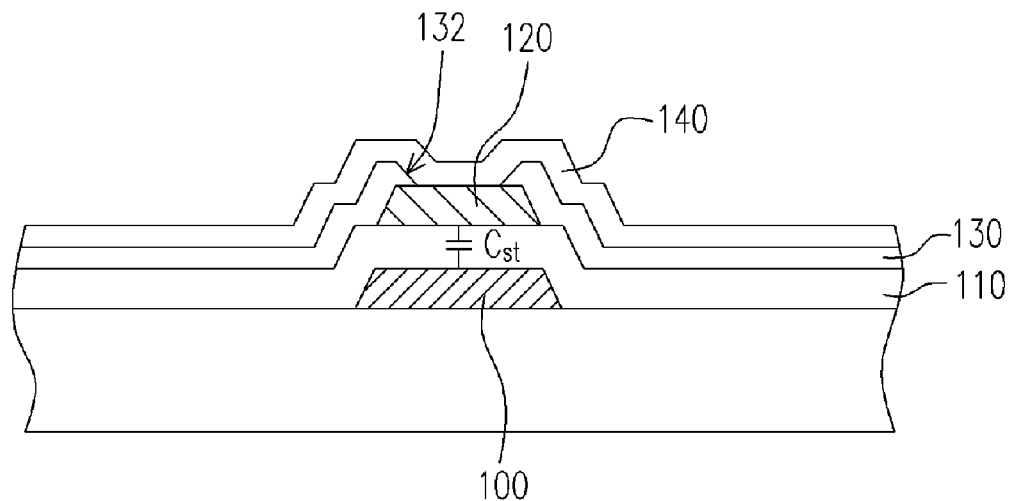
FIG. 1 shows a cross-sectional view of a conventional storage capacitor with the metal layer-insulating layer-metal layer (MIM) structure.
Figure 2:
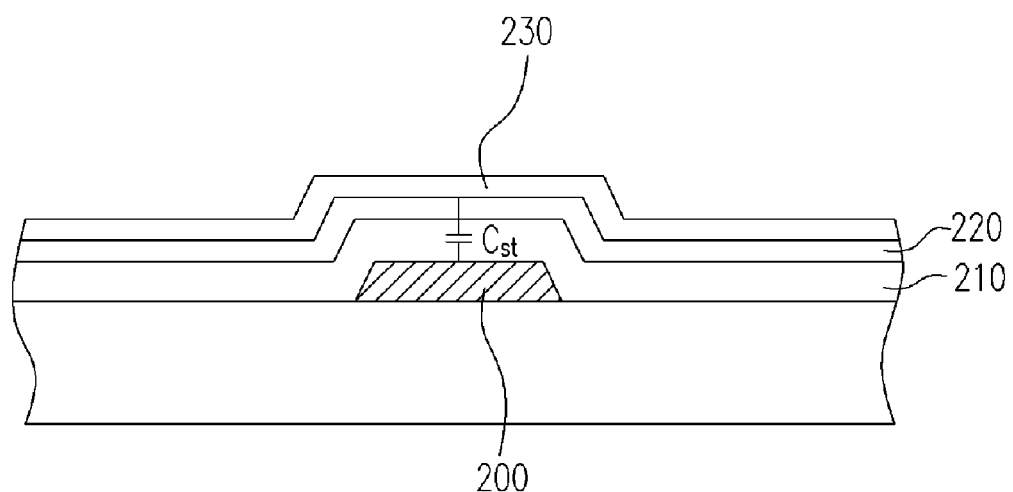
FIG. 2 shows a cross-sectional view of a conventional storage capacitor with the (metal layer-insulation layer-indium tin oxide layer (MII) structure.
Figure 3:
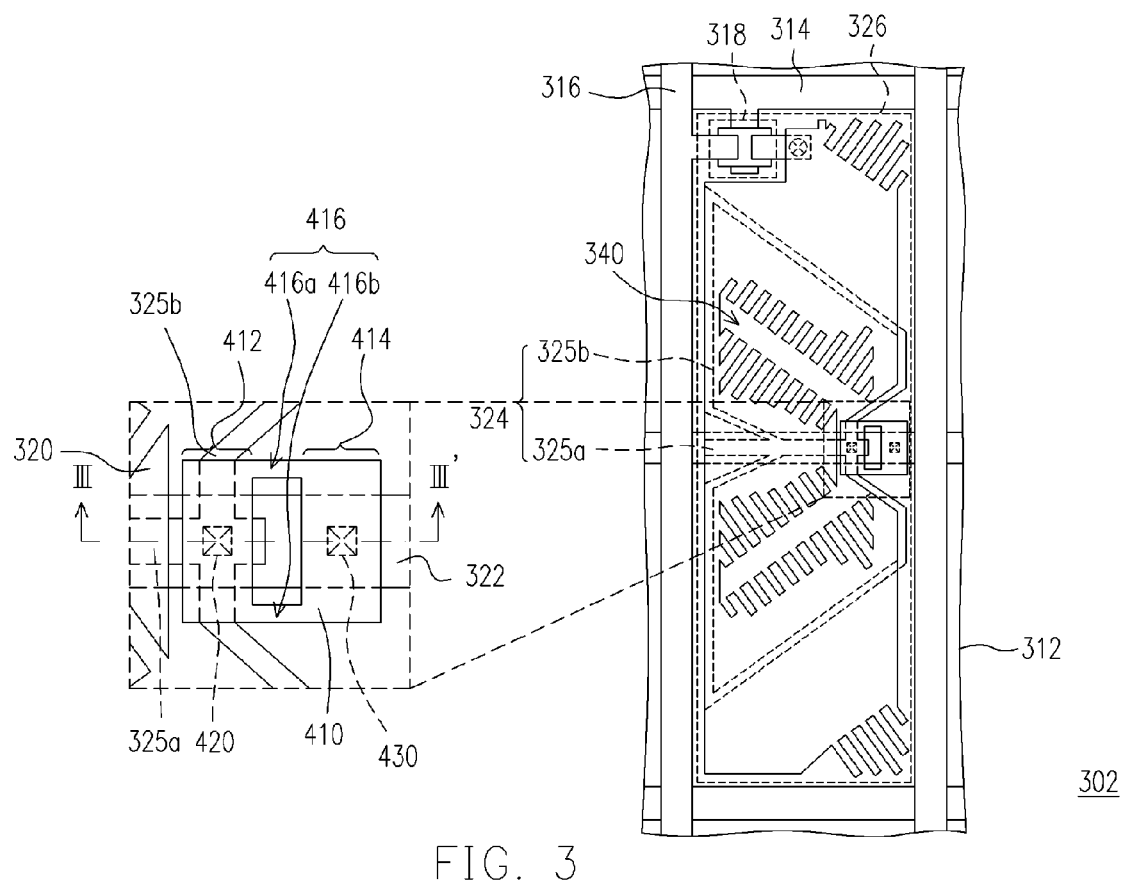
FIG. 3 shows a top view of a part of the thin film transistor array according to an embodiment of the present invention.
Figure 4:
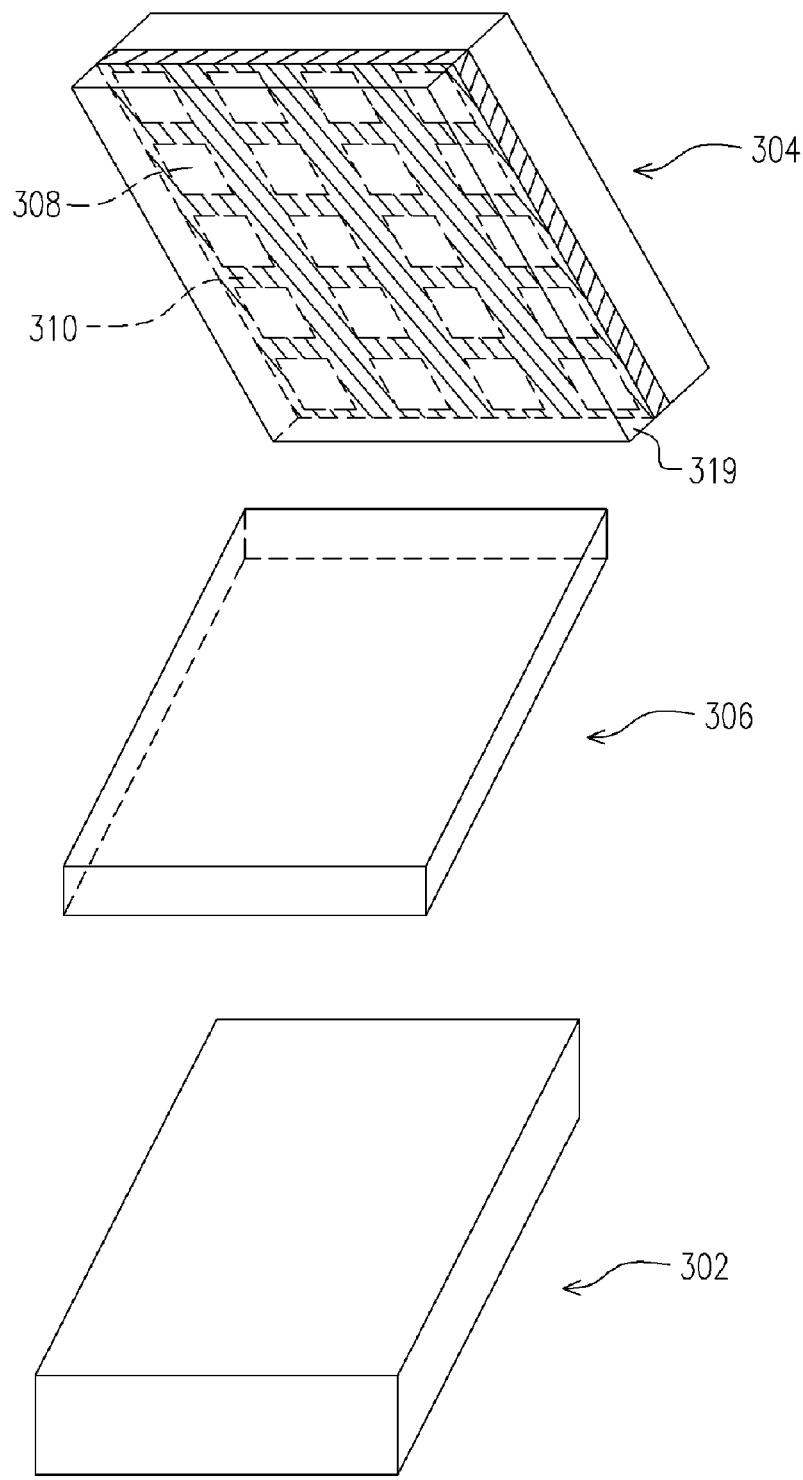
FIG. 4 shows n exploded view of a liquid crystal display apparatus, which includes the thin film transistor array as shown in FIG. 3.

FIG. 3 shows a top view of a part of the thin film transistor array according to one embodiment of the present invention. FIG. 4 shows an exploded view of a liquid crystal display apparatus with multi-domain vertical alignment (MVA), which is constructed with the thin film transistor array as shown in FIG. 3. In FIG. 4, the thin film transistor array 302 is applicable in a multi-domain vertical alignment (MVA) liquid crystal display apparatus 300, constructed with a color filter substrate 304 and a liquid crystal layer 306. The color filter substrate 304 is mainly comprised with a plurality of color filter substrate thin films 308, a black matrix 310 and a common electrode 319. The common electrode 319 includes several protrusions or several first slits (not shown in FIG. 4, and are illustrated in other figured). The liquid crystal layer 306 is formed with a plurality of liquid crystal molecules (not show in FIG. 4).

In FIG. 3, the thin film transistor array 302 is mainly comprised of a substrate 312, several scan lines 314, several data lines 316, several thin film transistors 318, several pixel electrodes 320, several common lines 322, several lower electrodes 324 and several connecting conductive layers 410. The data lines 316 and the scan lines 314 are positioned on the substrate 312, and define a plurality of pixel areas 326 on the substrate 312 (FIG. 3 uses only one pixel area 326 as example). The thin film transistor 318 and the pixel electrode 320 all are positioned in the pixel area 326. The thin film transistor 318 is driven by the scan line 314 and the data line 316, and the pixel electrode 320 is electrically connected with the corresponding thin film transistor 318. The material of the pixel electrode 320 is, for example, indium tin oxide ITO, indium zinc oxide IZO or other transparent electric conductive material.

Moreover, several second slits are formed in the pixel electrode 320, for example, for changing the electric field. The incline direction of the liquid crystal molecule (not show in FIG. 3) of the neighboring second slit 340 is thereby changed to increase the visible range of the display panel.

In FIG. 3, the common line 322 is positioned on the substrate 312, and each common line 322 is located between the two neighboring scan lines 314, a portion of the pixel electrode 320 is positioned over the common line 322. The material of the common line 322 is, for example, a metal material. More specifically, the lower electrode 324 is constructed with the electrode main body 325a and several electrode branches 325b, wherein the electrode main body 325a is positioned between the pixel electrode 320 and the corresponding common line 322, and the electrode branches are positioned in the pixel area where emitting efficiency is poor to avoid affecting the aperture ratio of the pixel electrode. Furthermore, in each pixel area 326, the pixel electrode 320 covers parts of these electrode branches 325b, and these electrode branches 325b are used for increasing the storage capacitance of each pixel area 326.

Figure 5:
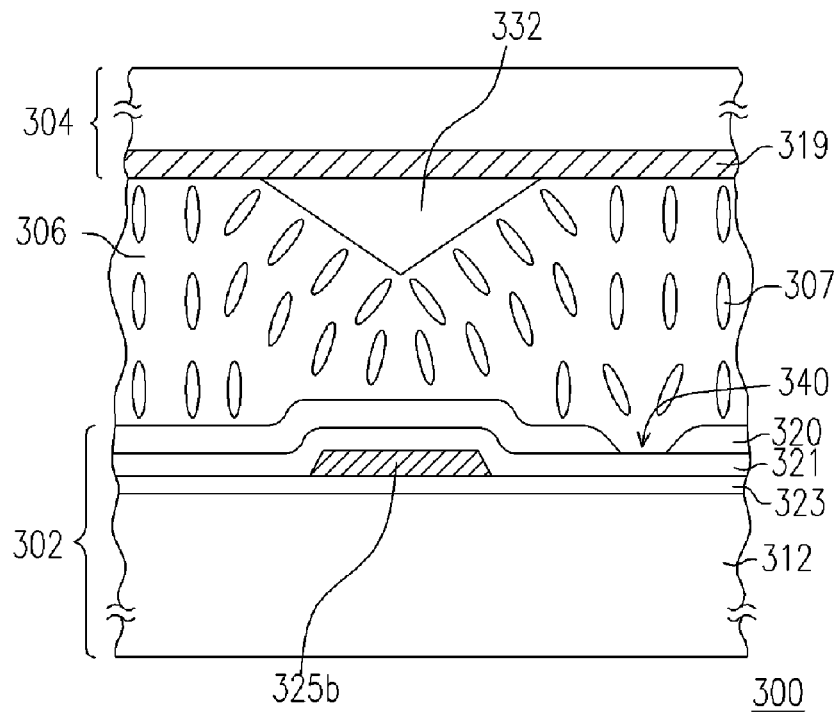
FIG. 5 and FIG. 6 are respectively the cross-sectional views of the liquid crystal display apparatus in different embodiments of the present invention.
Figure 6:
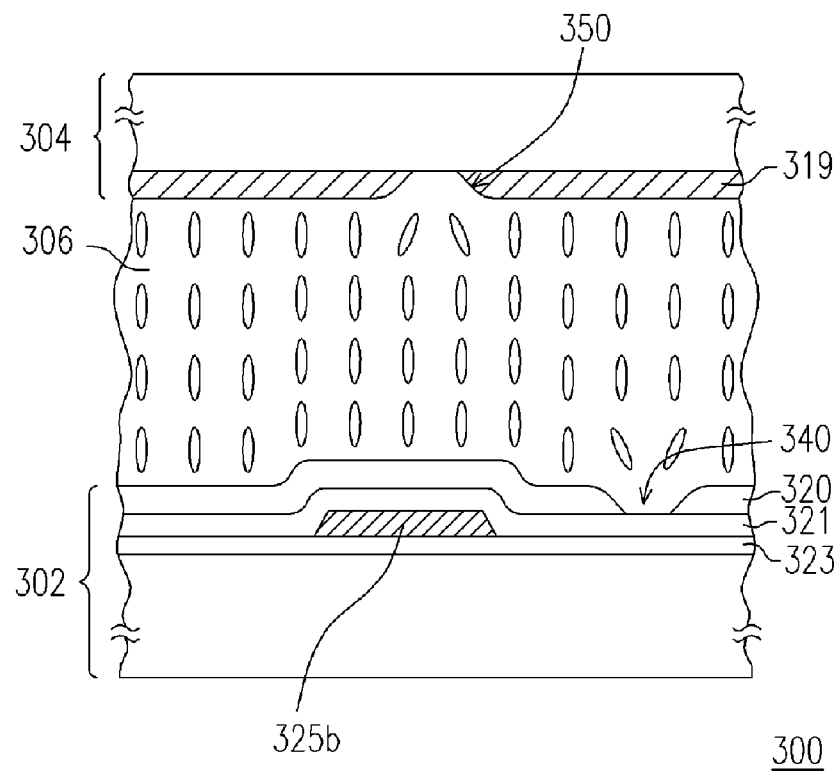

For example, in FIG. 5 and FIG. 6, several protrusions 332 (as FIG. 5) or several first slits 350 (as FIG. 6) are disposed on the common electrode 319 of the color filter substrate 304, for achieving the same effect as the second slit 340 over the pixel electrode 320. In other words, by changing the incline direction of the neighboring protrusions 332 or the liquid crystal molecule 307 of the first slit 350, the visible range of the liquid crystal display apparatus is increased.

Figure 8:
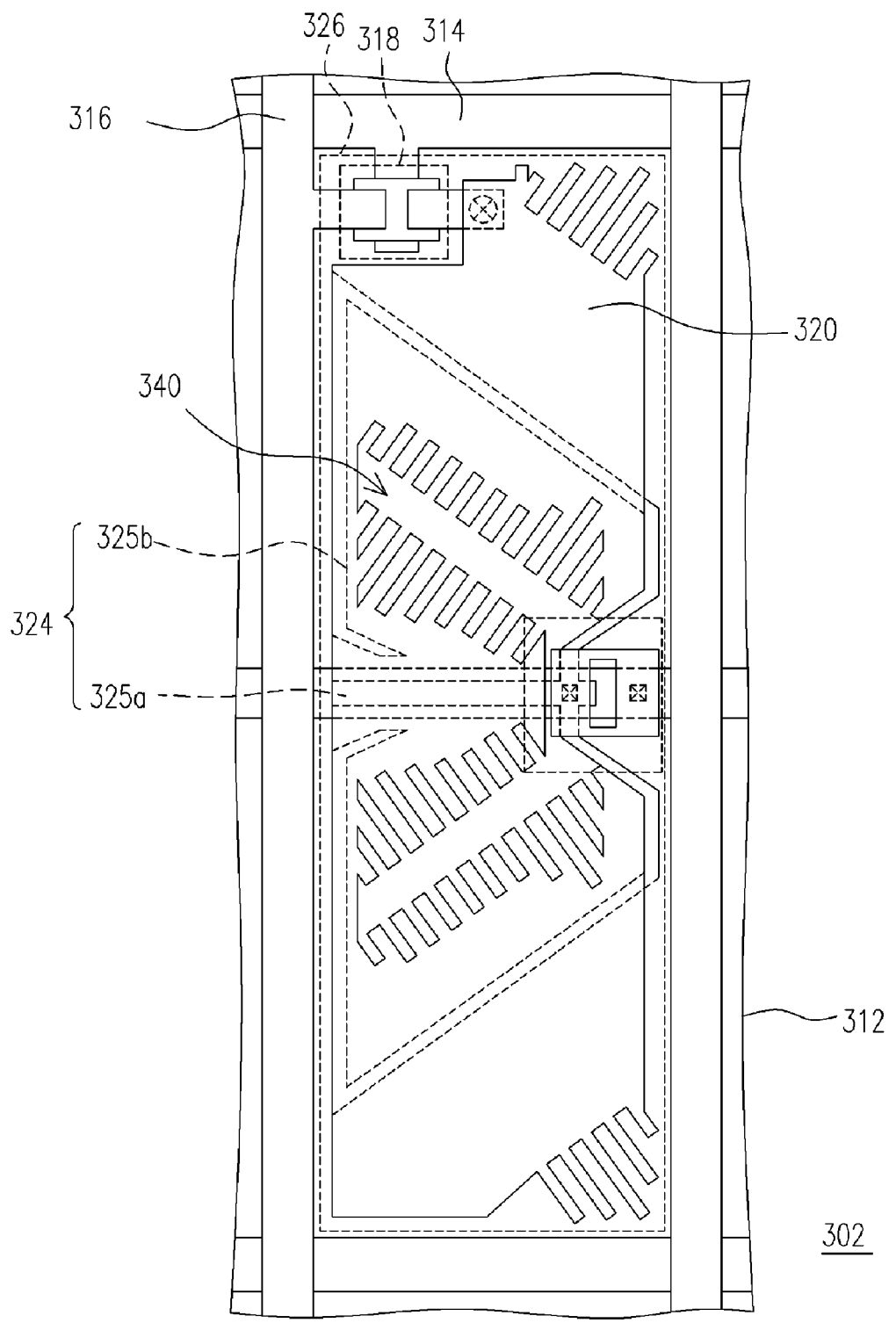
FIG. 8 shows a top view of a part of the thin film transistor array according to another embodiment of the present invention.

In FIG. 5 and FIG. 6, the electrode branch 325b of the present embodiment is positioned corresponding with the protrusions 322 of the common electrode 319 of the color filter substrate 304, or on the gate electrode insulating layer 323 of the first slit 350. Further, the electrode branch 325b is covered by the protective layer 321. Therefore, the electrode branch 325b is electrically insulated from the pixel electrode 320. Furthermore, the electrode branch 325b is designed to be offside from the second slit 340 (as FIG. 3 and FIG. 8), or overlapped with the black matrix 310 of the color filter substrate 304 (as FIG. 9).

In FIG. 3, the connecting conductive layer 410 is disposed in each pixel area 326, over parts of the electrode main body 325a of the electrode 324 and the common line 322, for electrically connecting with the lower electrode 324 and the common line 322. The formation of the connecting conductive layer 410 and the pixel electrode 320 can be completed in the same manufacturing process. In other words, the connecting conductive layer 410 can be the same material as that of the pixel electrode 320, for example, indium tin oxide ITO, indium zinc oxide IZO or other transparent electric conductive material.

In FIG. 3, the connecting conductive layer 410 is preferably constructed with a first contact 412, a second contact 414 and a neck portion 416. The first contact 412 is positioned over a part of the electrode main body 325a of the lower electrode 324, and the second contact 414 is positioned over a part of the common line 322. The first contact window 420 and the second contact window 430 are constructed in the protective layer 321 and the gate insulating layer 323. The first contact 412 of the connecting conductive layer 410 is electrically connected with the electrode main body 325a of the lower electrode 324 through the first contact window 420, and the second contact 414 of the connecting conductive layer 410 is electrically connected with the common line 322 through the second contact window 430.

Figure 7:
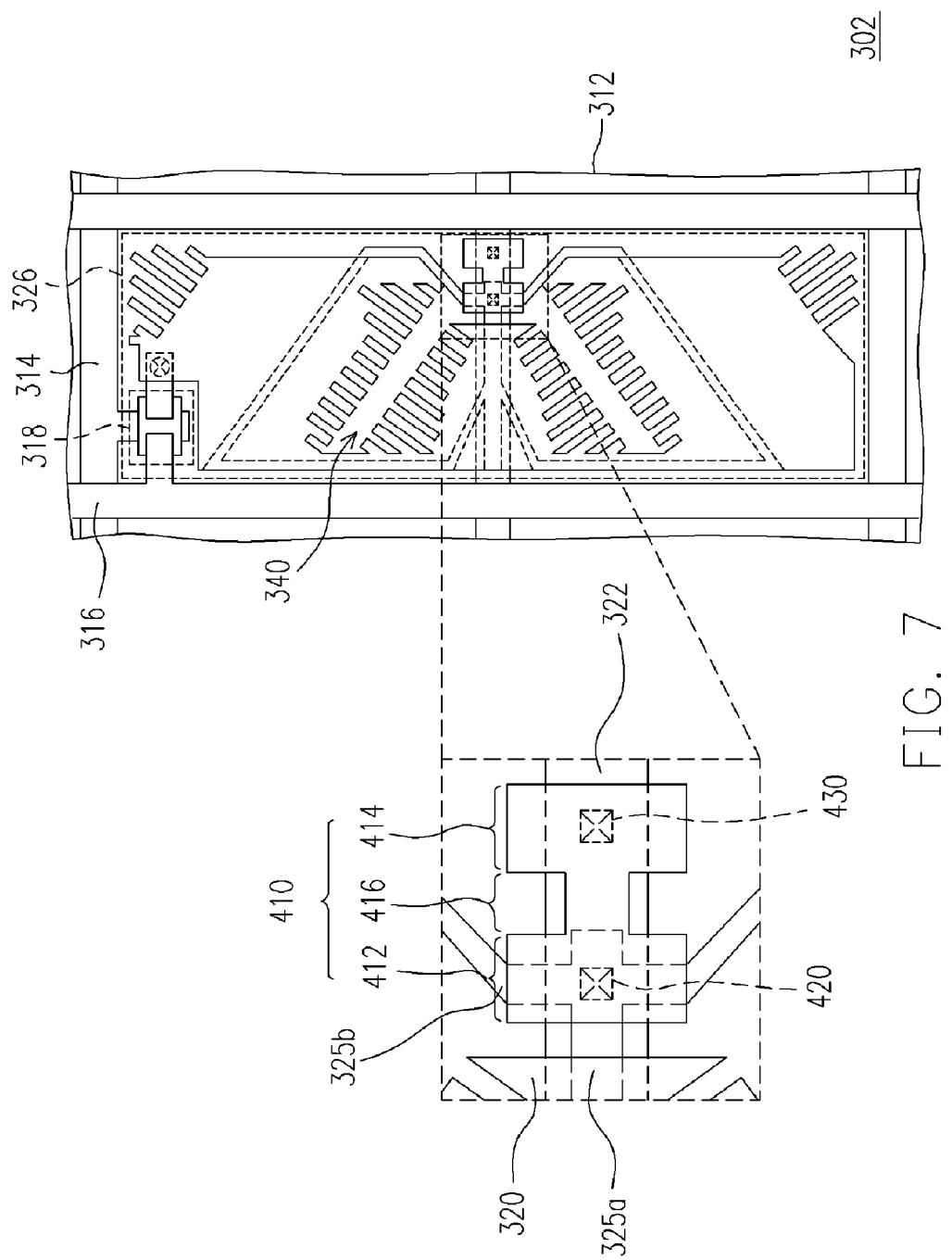
FIG. 7 shows a top view of a part of a thin film transistor array of another embodiment of the present invention.

The neck portion 416 connects the first contact 412 and the second contact 414. In the present embodiment, the neck portion 416 includes, for example, an upper neck portion 416a and a lower neck portion 416b. Of course, in other embodiments of the present invention, the neck portion 416 can be a single neck portion, as shown in FIG. 7. The present invention does not limit the neck portion's 416 shape, quantity or position between the first contact 412 and the second contact 414.

Figure 10:
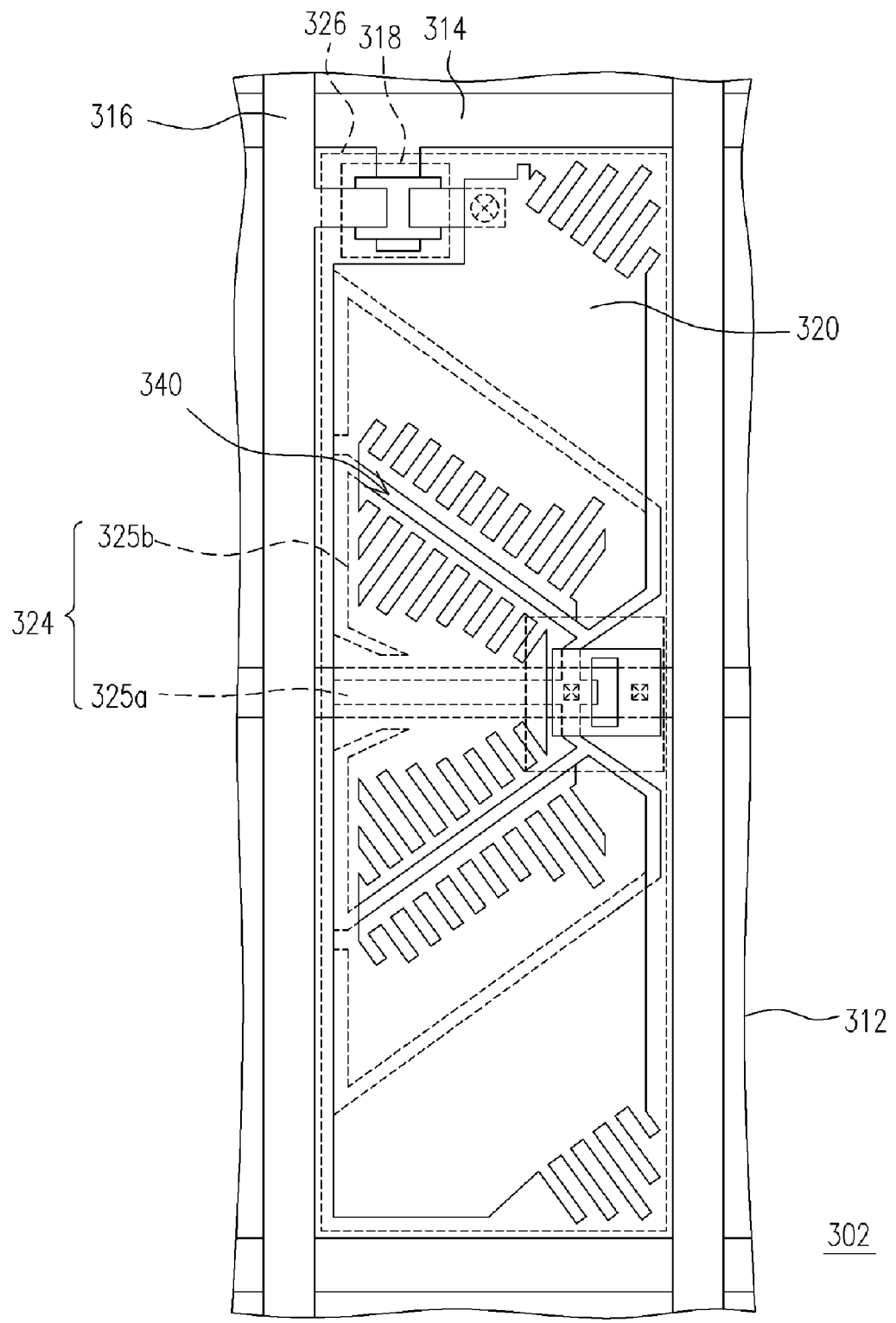
FIG. 10 to FIG. 12 show the top views of a part of the thin film transistor array according to different embodiments of the present invention.
Figure 11:
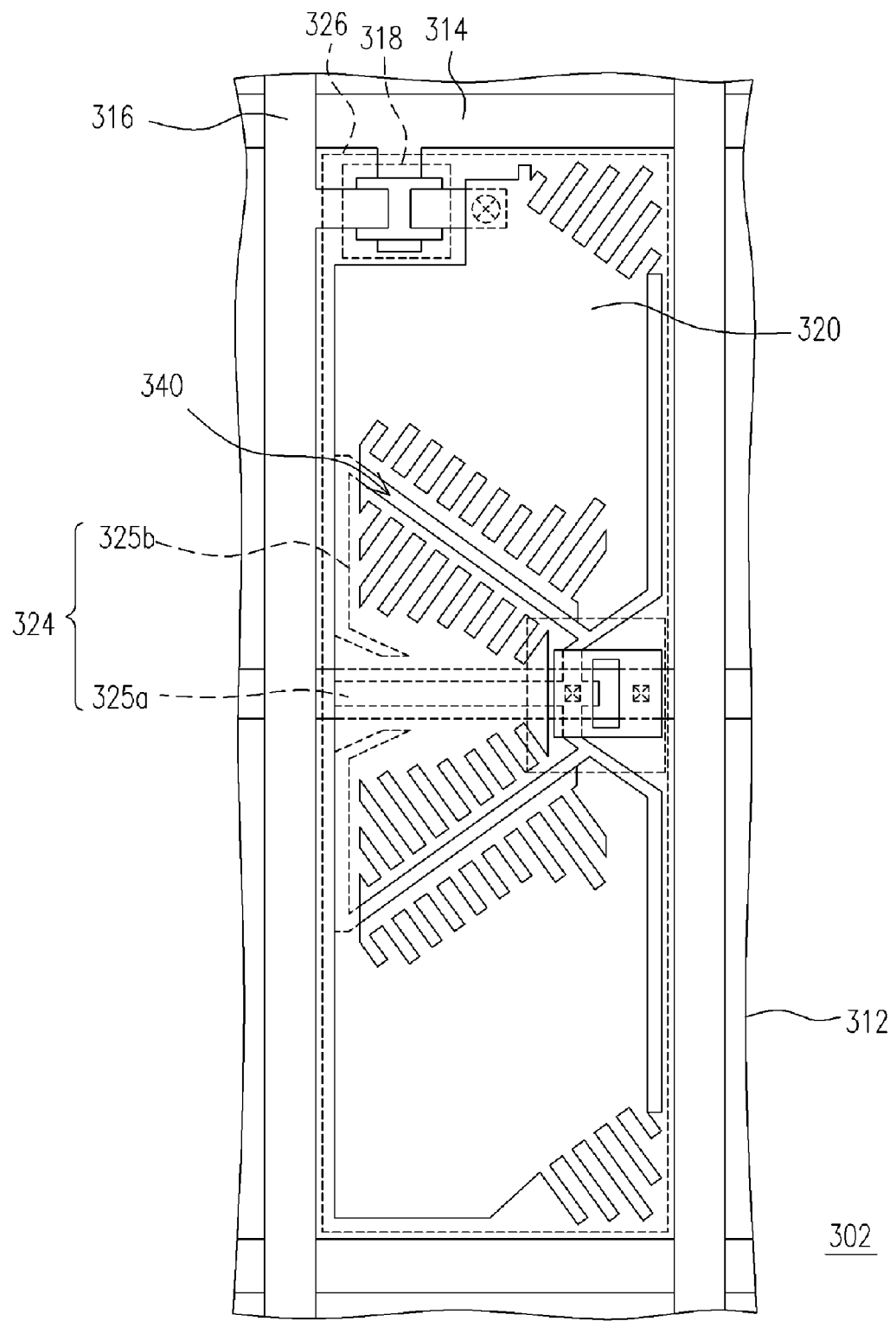
Figure 12:
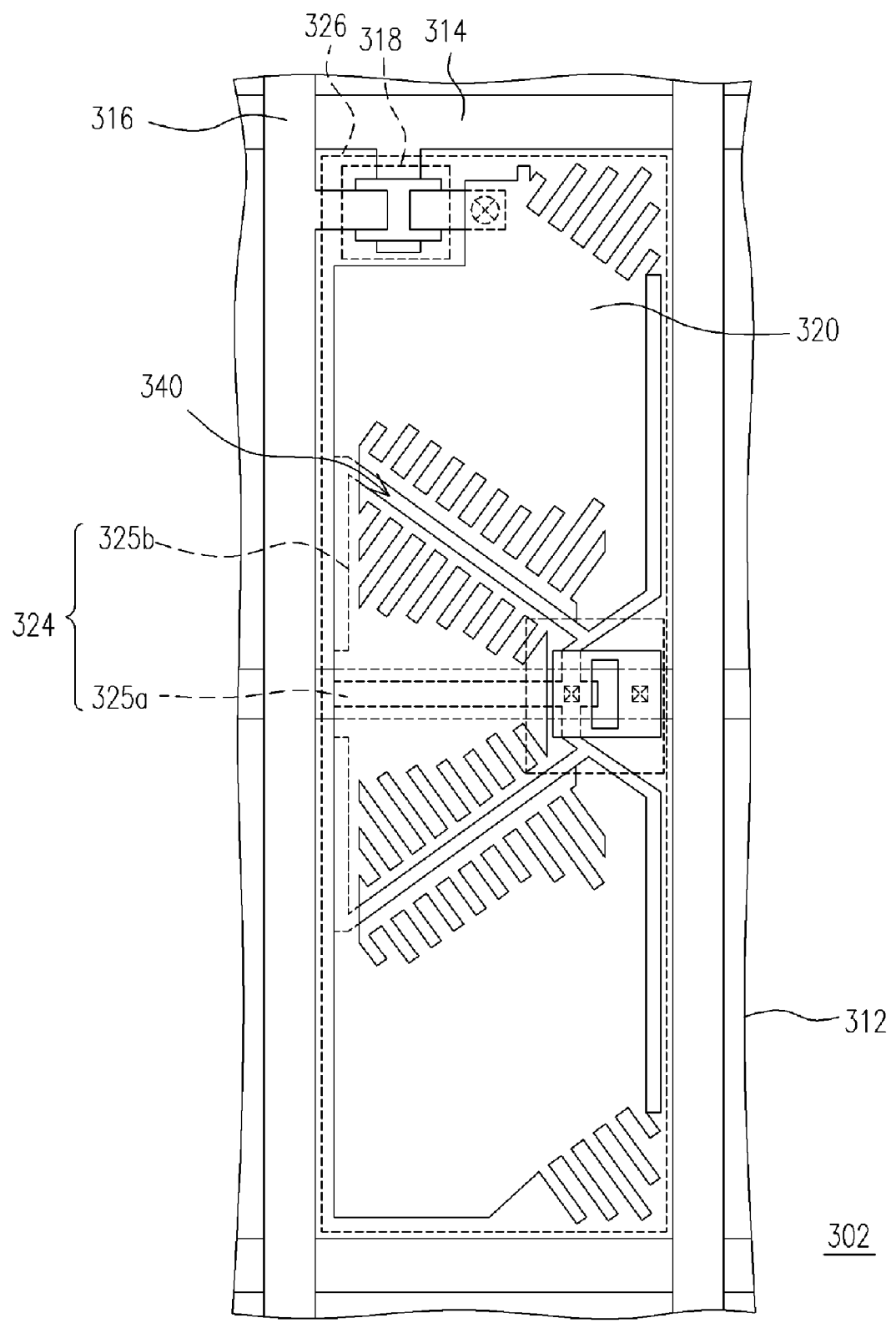

Furthermore, the present invention does not limit distribution pattern of the electrode branch 325b of the lower electrode 324, it can also be as shown in FIG. 10 to FIG. 12.

Figure 13:
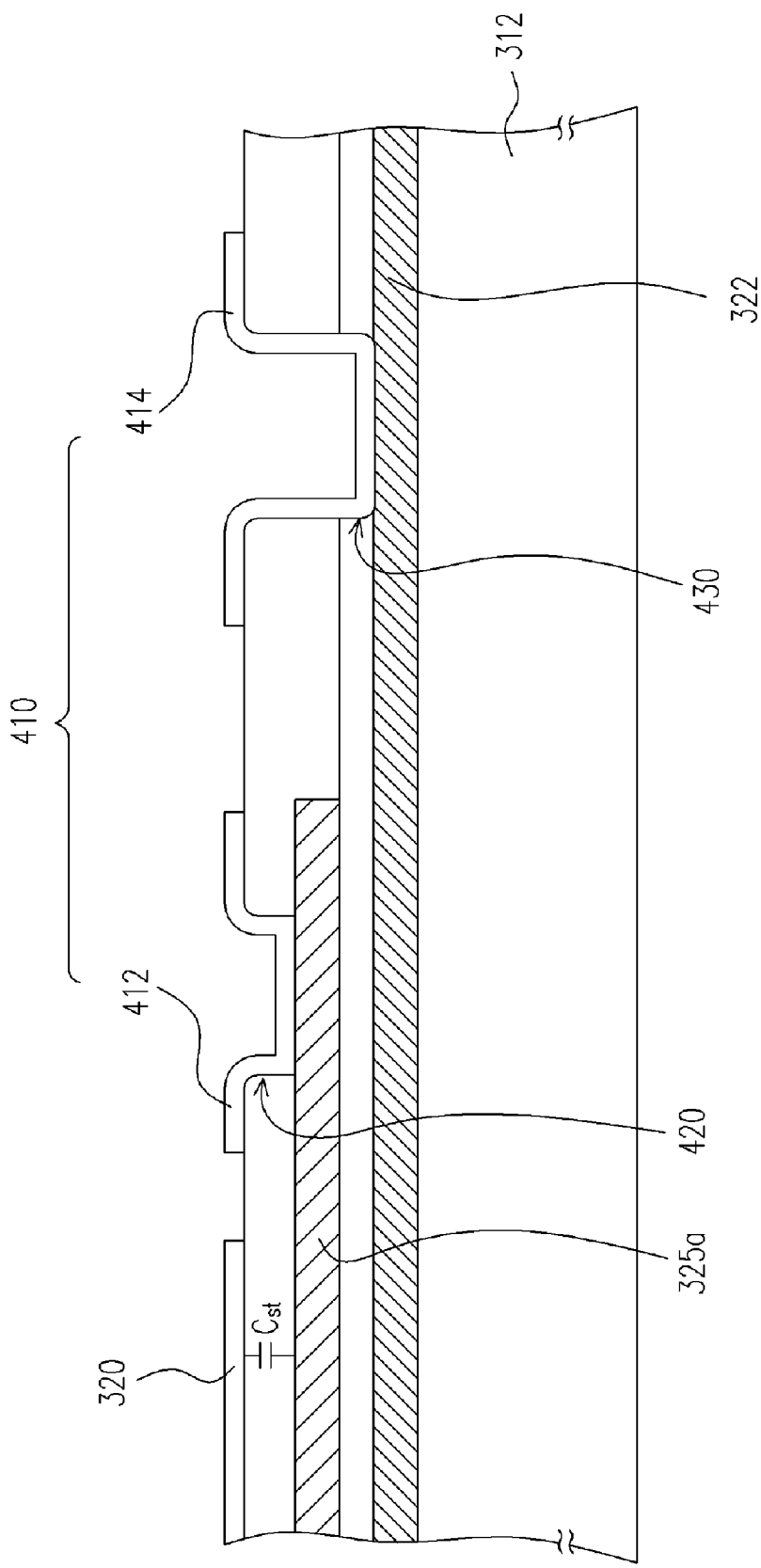
FIG. 13 shows the cross-sectional view of the thin film transistor array along the cutting III-III' line in FIG. 3.

FIG. 13 shows the cross-sectional view of the thin film transistor array along the cutting line III-III' line in FIG. 3. In FIG. 3 and FIG. 13, the electrode main body 325a of the lower electrode 324 is electrically connected with the common line 322 through the connecting conductive layer 410. Therefore, the storage capacitor Cst of the present embodiment is a capacitor with the MII structure, which is constructed with the electrode main body 325a of the lower electrode 324, the protective layer 321 and the pixel electrode 320. It is important to note that although the illustrated embodiment herein refers to the application of the common line 322 as the alternate capacitor conductive layer coupled to the lower electrode 324, it is to be understood that the embodiment is presented by way of example and not by way of limitation. In other embodiments of the present invention, if the lower electrode is positioned above other alternate capacitor conductive layer (not shown in the Figure), it also can be electrically connected with a corresponding alternate capacitor conductive layer through the connecting conductive layer 410, to construct the capacitor with the MII structure that comprises the electrode main body 325a of the lower electrode 324, the protective layer 321 and the pixel electrode 320.

Figure 9:
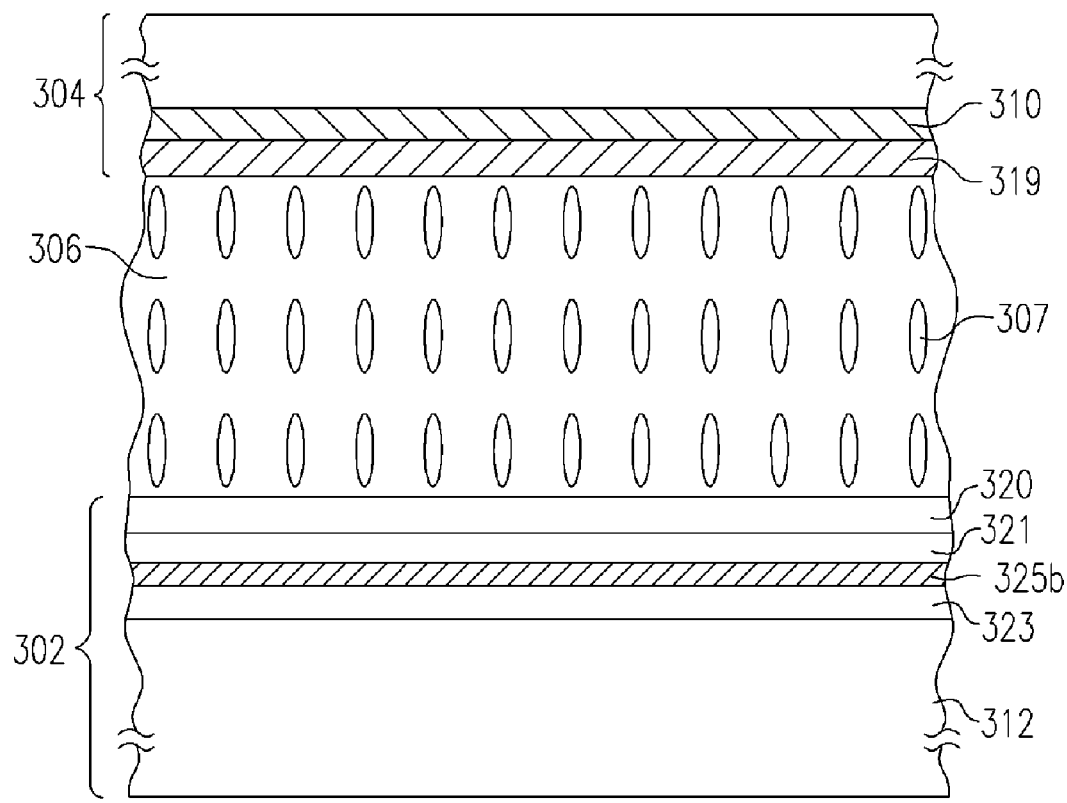
FIG. 9 shows a cross-sectional view of the liquid crystal display apparatus according to another embodiment of the present invention.

Furthermore, with the protective layer 321, the pixel electrode 320 and the electrode branch 325b of the lower electrode 324, a storage capacitor Cst with a metal layer-insulation layer-indium zinc oxide MII structure is provided, as shown in FIG. 5, FIG. 6 and FIG. 9.

For further describing the advantages of the thin film transistor array of the present invention, the following embodiment describes the laser repairing process of the thin film transistor array of the present invention.

Figure 14:
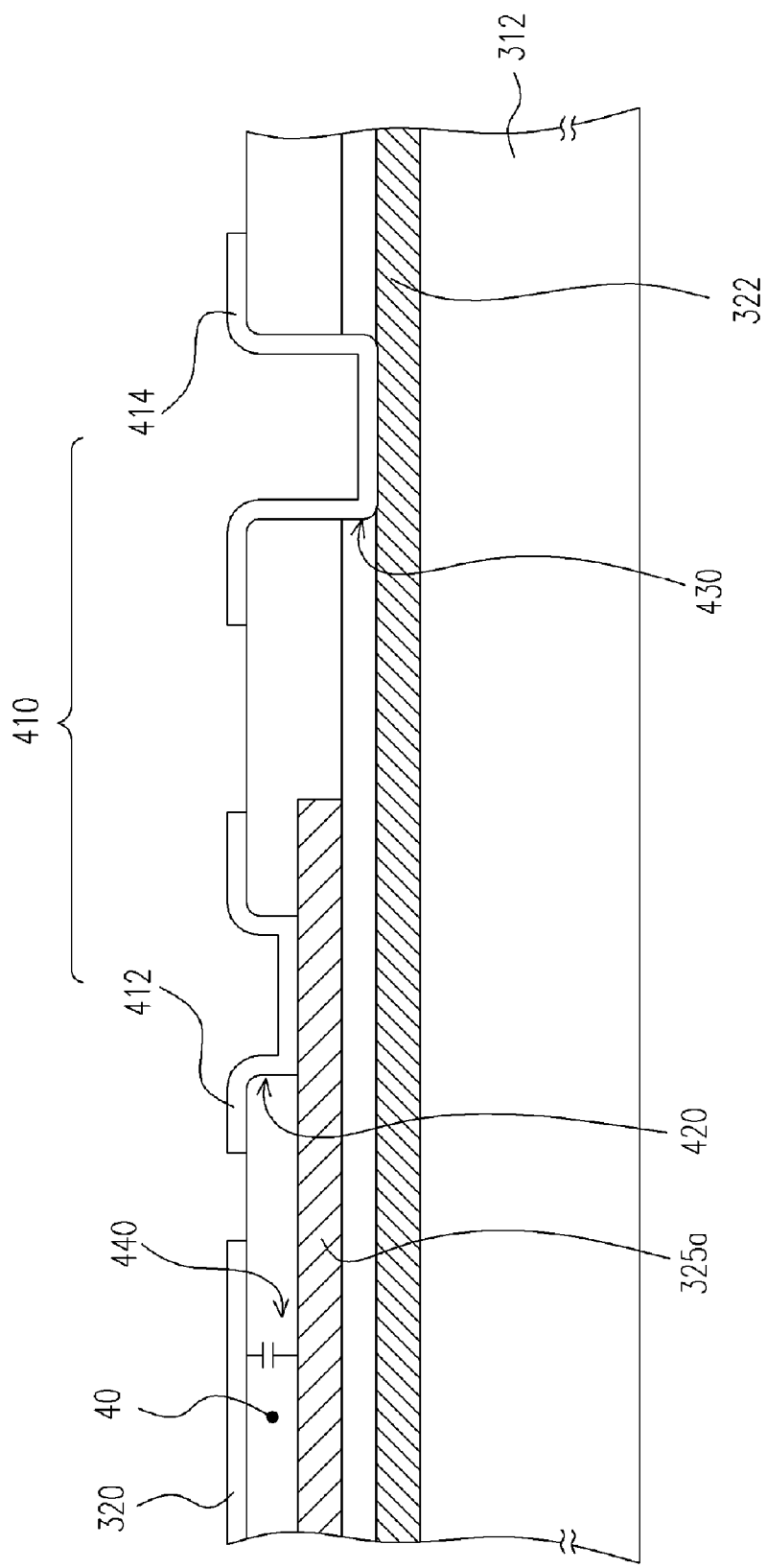
FIG. 14 shows a cross-sectional view of the thin film transistor array in FIG. 13 with the presence of particle or cavity.

FIG. 14 shows a cross-sectional view of the thin film transistor array in FIG. 13 with presence of particles or cavities. In FIG. 14, when a particle 40 or a cavity is present between the electrode main body 325a of the lower electrode 324 (and/or electrode branch (not shown in figure), the electrode main body 325a is used only in the example) and the pixel electrode 320 (in other words, in the protective layer 321), a defective capacitor with the electrode main body 325a of the lower electrode 324, the protective layer 321 and the pixel electrode 320 is constructed. A capacitor leakage thus occurs. As a result, the pixel display is abnormal and the display quality is poor, and a repair process is needed to perform on the abnormal display pixel.

In FIG. 3 and FIG. 14, the method of repairing the above mentioned the abnormal display pixel includes cutting off the neck portion 416 of the connecting conductive layer 410 for electrically insulating the first contact 412 of the connecting conductive layer 410 from the second contact 414, and for electrically insulating the common line 322 from the electrode main body 325a of the lower electrode. Then, the pixel electrode 320 and the electrode main body 325a are welded together for electrically connecting the pixel electrode 320 and the electrode main body 325a. The method of cutting off the neck portion 416 of the connecting conductive layer 410 is to use, for example, laser cutting, and the method of welding the pixel electrode 320 and the electrode main body 325a together is, for example, to use laser welding.

Figure 15:
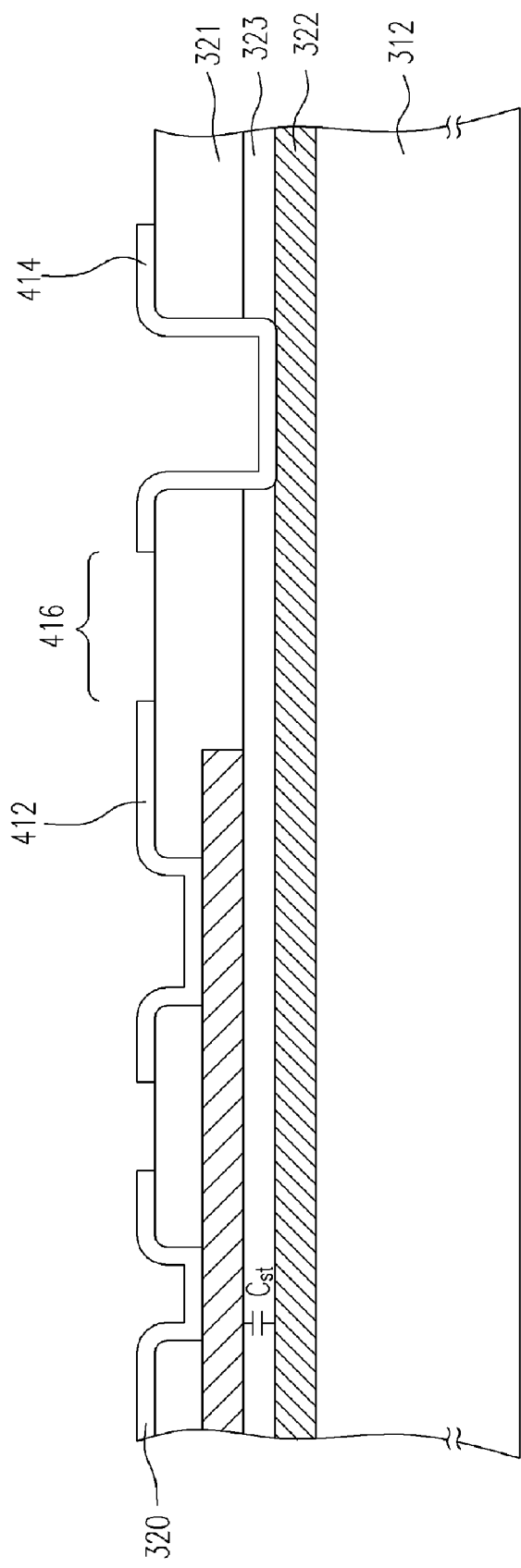
FIG. 15 shows a cross-sectional view of the pixel structure in FIG. 14 subsequent to a laser repair treatment.

It is important to note that, after cutting of the neck portion 416 of the connecting conductive layer 410 and welding the electrode main body 325a of the pixel electrode 320 as shown in FIG. 15, the capacitor Cst with the MII structure in this pixel is transformed into a capacitor with the MIM structure. The capacitor with the MII structure is constructed with the electrode main body 325a, the protective layer 321 and the pixel electrode 320 as shown in FIG. 13, while the capacitor with MIM structure is constructed with the common line 322, the gate electrode insulating layer 323 and the electrode main body 325a.

It can be understood from the above disclosure that, after the above mentioned repair process is performed on the thin film transistor array of the present invention, the structure of the storage capacitor is transformed to eliminate the abnormal display problem caused by the presence of particles.

Figure 16:
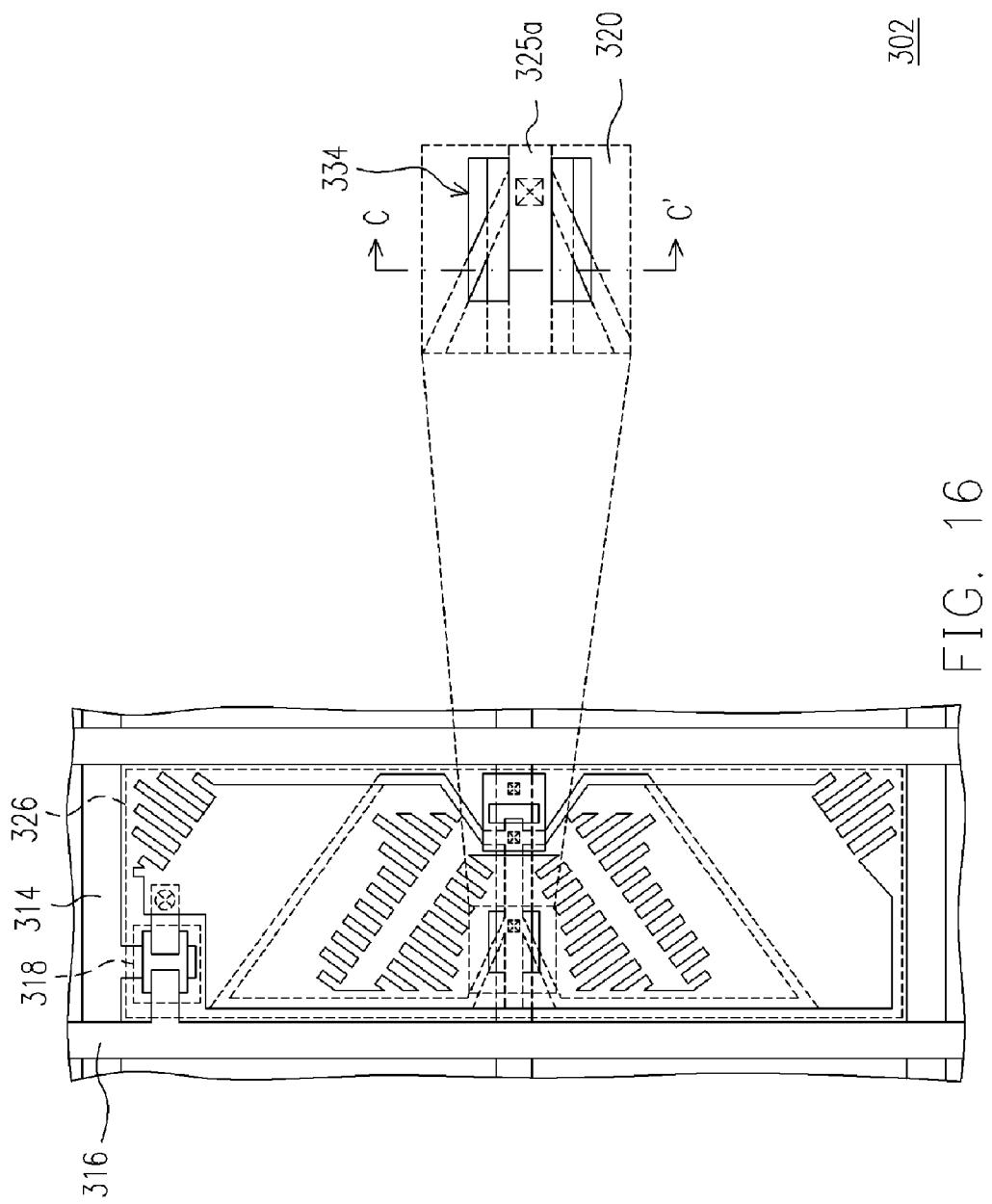
FIG. 16 shows a top view of a part of the thin film transistor array according to an embodiment of the present invention.
Figure 17:
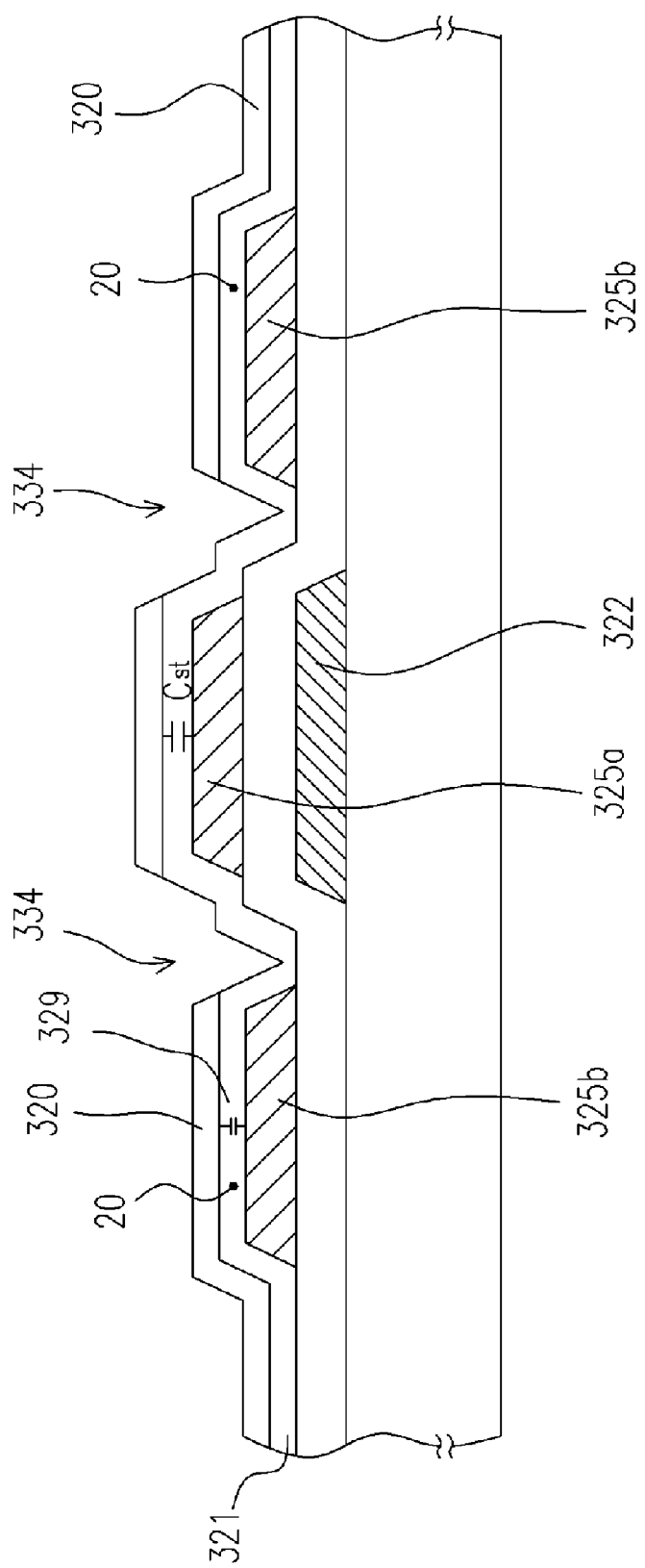
FIG. 17 shows the cross-sectional view of the thin film transistor array along the cutting line C-C' in FIG. 16.

Furthermore, in the other embodiment of the present invention, there are other methods to repair the thin film transistor array of the present invention. FIG. 16 shows a bottom view of a part of the thin film transistor array of an embodiment of the present invention. FIG. 17 shows the cross-sectional view of the thin film transistor array substrate in FIG. 16, along the C-C' cutting line.

Referring to both FIG. 16 and FIG. 17, when a first particle 20 and/or cavity is present between one of the electrode branches 325b of the above mentioned lower electrode 324 and the corresponding pixel electrode 320. A defective capacitor 329, which includes the electrode branch 325b, the protective layer 321 and the pixel electrode 320, is resulted. A capacitor leakage is likely to occur. Ultimately, the pixel display is abnormal and display quality is poor. A repair process is thus needed to rectify the abnormal display pixel. The repair method mainly includes cutting off the electrode branch 325b of the defective capacitor for electrically insulating the electrode branch 325b from the lower electrode 324, so as to maintain the normal function of other storage capacitors.

Furthermore, in order to facilitate the subsequent repair process, during the manufacturing process of the pixel electrode 320, an aperture 334 is preserved, in advance, as shown in FIG. 16, at the neighborhood of the junction of the electrode branch 325b and the electrode main body 325a. Therefore, when a defective capacitor 329 is generated, the electrode branch 325b can be cut off through the aperture 334 to electrically insulate the electrode branch 325b of the defective capacitor 329 from the electrode main body 325a and to ensure the normal functional of other storage capacitor.

Figure 18:
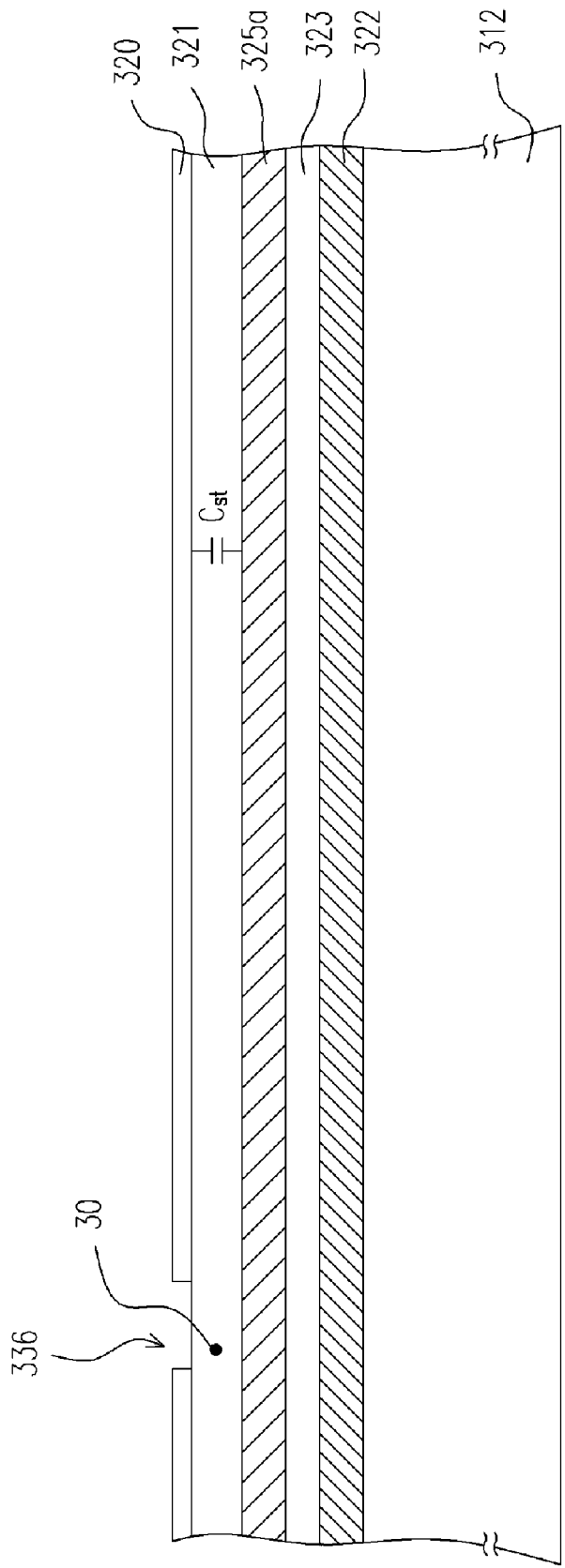
FIG. 18 shows a cross-sectional view of a thin film transistor array, illustrating the repairing of the thin film transistor array with the presence of a particle or a cavity disposed between the pixel electrode and the lower electrode according to an embodiment of the present invention.

FIG. 18 shows is a cross-sectional view of a thin film transistor array, illustrating the repairing of the thin film transistor array with the presence of a particle or a cavity disposed between the pixel electrode and the lower electrode according to an embodiment of the present invention. When the pixel electrode 320 and the corresponding electrode main body 325a of the lower electrode 324 comprise a second particle 30 (or cavity) therebetween, a portion of the pixel electrode 320 over the corresponding second particle 30 (or cavity) can be removed to electrically insulate the second particle 30 (or cavity) from the pixel electrode 320. In the present embodiment, the laser deleting method is used, for example, to form the aperture 336, wherein the aperture 336 exposes the particle 30 (or cavity).

In light of the above, the storage capacitance in the liquid crystal display apparatus is increased through the electrode branch of the lower electrode in order to improve the display quality of the panel according to the present invention. Further, when a capacitor leakage occurs at the electrode branch of the lower electrode, the repairing process will cut off the electrode branch where the capacitor leakage occurs to electrically insulate the electrode branch from the lower electrode in order to maintain a normal function of other storage capacitors.

Furthermore, in one embodiment of the present invention, the electrode branch of the lower electrode is positioned in the pixel area of the liquid crystal panel where emitting efficiency is poor, so that the aperture ratio of the pixel is not adversely affected by the electrode branch disposed in the pixel area. In other words, the storage capacitance is increased without affecting the aperture ratio according to the present invention. Accordingly, the liquid crystal display apparatus of the present invention has a better aperture ratio and a higher storage capacitance at the same time, so as to increase the emitting efficiency of the liquid crystal display apparatus.

Furthermore, according to the present invention, when the repair process is performed to the thin film transistor array having the connecting conductive layer, the storage capacitor of the MII structure is transformed into a storage capacitor of the MIM structure. The leakage problem of the storage capacitor of the MII structure is thereby resolved.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A thin film transistor array substrate, adapted to form a liquid crystal display apparatus with a color filter substrate and a liquid crystal layer, wherein a black matrix is disposed on the color filter substrate, and wherein at least one of a plurality of protrusions and a plurality of first slits are disposed on the color filter substrate, the thin film transistor array substrate comprising:
    a substrate;
    a plurality of scan lines disposed on the substrate;
    a plurality of data lines disposed on the substrate, wherein the data lines and the scan lines define a plurality of pixel areas on the substrate;
    a plurality of thin film transistors, each of the thin film transistors being disposed in one corresponding pixel area, wherein the thin film transistors are driven through the scan lines and the data lines;
    a plurality of pixel electrodes, each of the pixel electrodes being disposed in one corresponding pixel area and electrically connecting with the corresponding thin film transistor;
    a plurality of common lines disposed on the substrate, wherein each of the common lines is disposed between two neighboring scan lines, and at least a part of the corresponding pixel electrode is over the corresponding common line;
    a plurality of lower electrodes, each of the lower electrodes comprising an electrode main body disposed between the corresponding pixel electrode and the corresponding common line, and one electrode branch partly corresponding with at least one of the plurality of protrusions and the plurality of first slits, and being overlapped with the black matrix, such that the corresponding pixel electrode covers a part of the corresponding electrode branch; and
    a plurality of connecting conductive layers, wherein each of the connecting conductive layer is disposed over a part of the electrode main body of the corresponding lower electrode and is disposed over a part of the corresponding common line, and each connecting conductive layer is electrically connected with the corresponding lower electrode and the corresponding common line, respectively.

2. The thin film transistor array substrate, of claim 1, wherein each of the connecting conductive layers comprises a first contact, a second contact, and a neck portion, the first contact is disposed over the part of the electrode main body of the corresponding lower electrode, the second contact is disposed over the part of the corresponding common line, and the neck portion connects the first contact and the second contact.

3. The thin film transistor array substrate of claim 2 further comprising a protective layer disposed between the pixel electrode and the lower electrode, and between apart of the connecting conductive layer and the lower electrode.

4. The thin film transistor array substrate of claim 3 further comprising a gate insulating layer disposed between the lower electrode and the common line, wherein the protective layer has a first contact window and a second contact window formed therein, the gate insulating layer has the second contact window formed therein, the first contact window exposes the electrode main body of the corresponding lower electrode, and the second contact window exposes the corresponding common line.

5. The thin film transistor array substrate of claim 4, wherein the first contact of the connecting conductive layer is electrically connected with the corresponding lower electrode through the first contacting window, and the second contact of the connecting conductive layer is electrically connected with the corresponding common line through the second contact windows.

6. The thin film transistor array substrate of claim 1, wherein the connection conductive layers and the pixel electrodes are comprised of the same material.

7. The thin film transistor array substrate of claim 1, wherein each of the pixel electrodes comprises at least a second slit, and the electrode branches of the lower electrodes are positioned offside from the second slit.

8. A method for repairing the thin film transistor array substrate of claim 1, comprising the step of:
    locating one defective capacitor formed between one lower electrode and one corresponding pixel electrode; and
    separating a part of the lower electrode or the corresponding pixel electrode.

9. The method of claim 8, wherein the step of separating comprises performing laser cutting.

10. The method of claim 8, wherein the defective capacitor is formed between one electrode branch of the lower electrode and the corresponding pixel electrode, the step of separating is to separate the electrode branch.

11. The method of claim 10, wherein the step of separating comprises performing laser deleting.

12. The method of claim 8, wherein the defective capacitor is formed between one electrode main body of the lower electrode and the corresponding pixel electrode, the step of separating is to separate the corresponding pixel electrode.

13. A method for repairing the thin film transistor array substrate of claim 2, comprising the step of:
    locating one defective capacitor formed between one electrode branch of one lower electrode and one corresponding pixel electrode;

cutting the neck portion of the corresponding connecting conductive layer of the defective capacitor to electrically insulate the corresponding common line from the corresponding lower electrode; and welding the corresponding pixel electrode of the defective capacitor with the lower electrode.

14. The method of claim 13, wherein the step of cutting comprises laser cutting and the step of welding comprises laser welding.

* * * * *